(12) United States Patent
Nanno et al.

(10) Patent No.: US 7,655,348 B2
(45) Date of Patent: Feb. 2, 2010

(54) CHIP-TYPE BATTERY

(75) Inventors: Tetsuo Nanno, Yao (JP); Tsunenori Yoshida, Yawata (JP)

(73) Assignee: Panasonic Corporation, Osaka (JP)

( * ) Notice: Subject to any disclaimer, the term of this patent is extended or adjusted under 35 U.S.C. 154(b) by 775 days.

(21) Appl. No.: 11/055,971

(22) Filed: Feb. 14, 2005

(65) Prior Publication Data

US 2005/0196668 A1    Sep. 8, 2005

(30) Foreign Application Priority Data

Mar. 5, 2004    (JP) .............................. 2004-062525

(51) Int. Cl.
*H01M 10/48* (2006.01)
*H01M 2/00* (2006.01)
*H01M 2/02* (2006.01)

(52) U.S. Cl. .......................... 429/90; 429/163; 429/178

(58) Field of Classification Search .............. 429/90–93
See application file for complete search history.

(56) References Cited

U.S. PATENT DOCUMENTS

| | | | | |
|---|---|---|---|---|
| 2,568,881 | A | * | 9/1951 | Albers-Schoenberg ...... 428/448 |
| 3,591,804 | A | * | 7/1971 | Minasian ..................... 378/165 |
| 4,791,267 | A | * | 12/1988 | Yokoyama et al. ..... 219/121.69 |
| 4,913,981 | A | * | 4/1990 | Hynes et al. ..................... 429/1 |
| 5,111,128 | A | * | 5/1992 | Branan et al. ............... 320/106 |
| 5,612,152 | A | * | 3/1997 | Bates .......................... 429/152 |
| 6,319,630 | B1 | * | 11/2001 | Hasegawa et al. ........... 429/162 |
| 2002/0163798 | A1 | * | 11/2002 | Richards ....................... 362/98 |
| 2005/0008908 | A1 | * | 1/2005 | Kaye et al. ..................... 429/20 |

FOREIGN PATENT DOCUMENTS

| | | |
|---|---|---|
| JP | 6-231796 | 8/1994 |
| JP | 6-232011 | 8/1994 |
| JP | 7-115041 | 5/1995 |
| JP | 11-026297 | 1/1999 |

OTHER PUBLICATIONS

Machine translation of JP 06-231796 to Takatani et al., Aug. 19, 1994.*

* cited by examiner

*Primary Examiner*—Dah-Wei D Yuan
*Assistant Examiner*—Steven Scully
(74) *Attorney, Agent, or Firm*—McDermott Will & Emery LLP

(57) ABSTRACT

In order to enhance versatility, a chip-type battery having a means for readily identifying a first terminal and a second terminal is provided. The chip-type battery includes: a body having a substantially rectangular parallelepiped shape and contains a plurality of power generating elements in a stack, each element including a sintered material; a first terminal having a first polarity; and a second terminal having a second polarity. The first terminal is provided at a first side face of the body. The second terminal is provided at a second side face of the body located on other than the first side face. The first terminal and the second terminal include different metal materials.

8 Claims, 7 Drawing Sheets

Fig. 1 - Prior Art
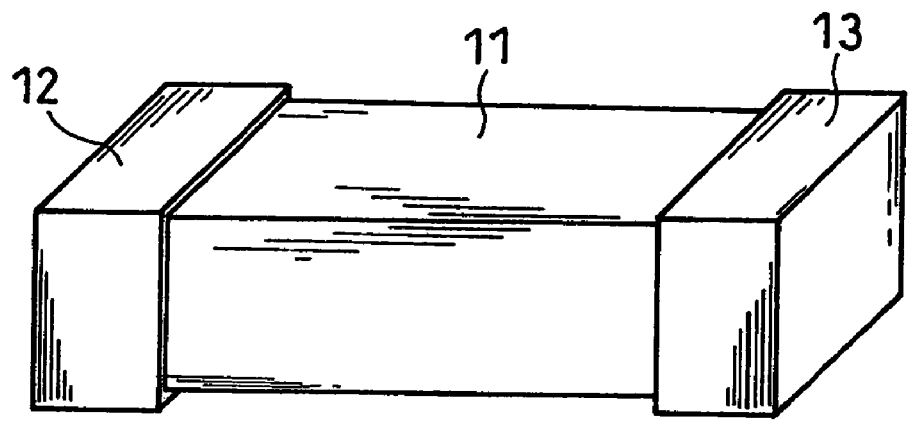
Fig. 2 - Prior Art
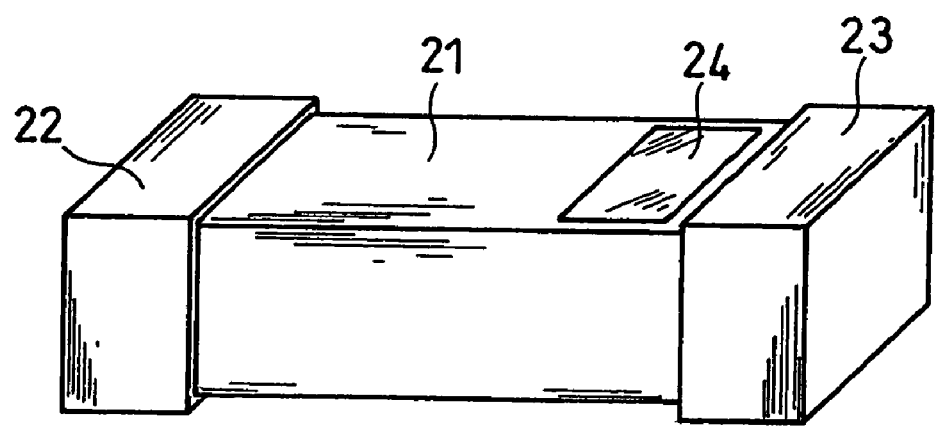

Fig. 3 - Prior Art
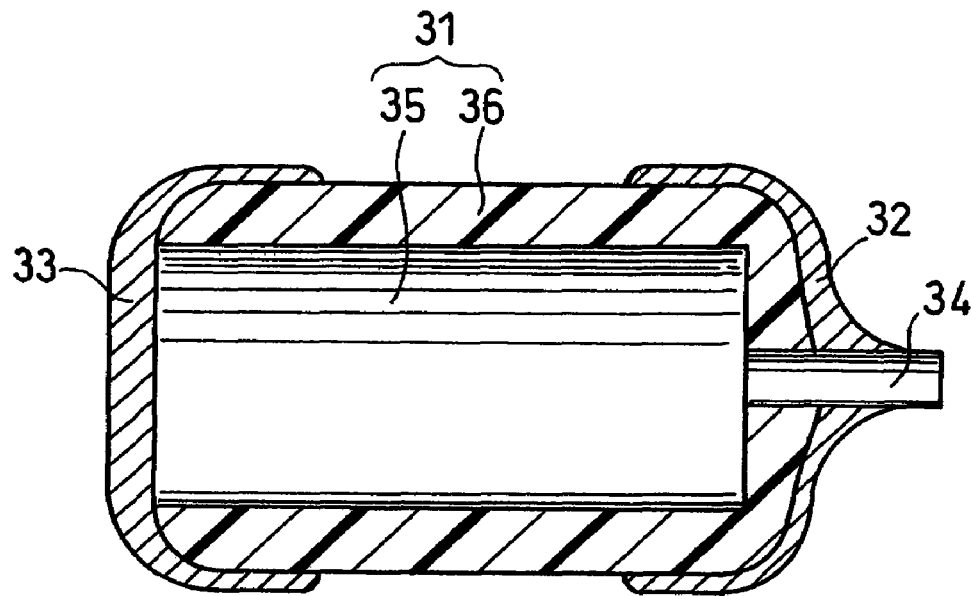
Fig. 4 - Prior Art
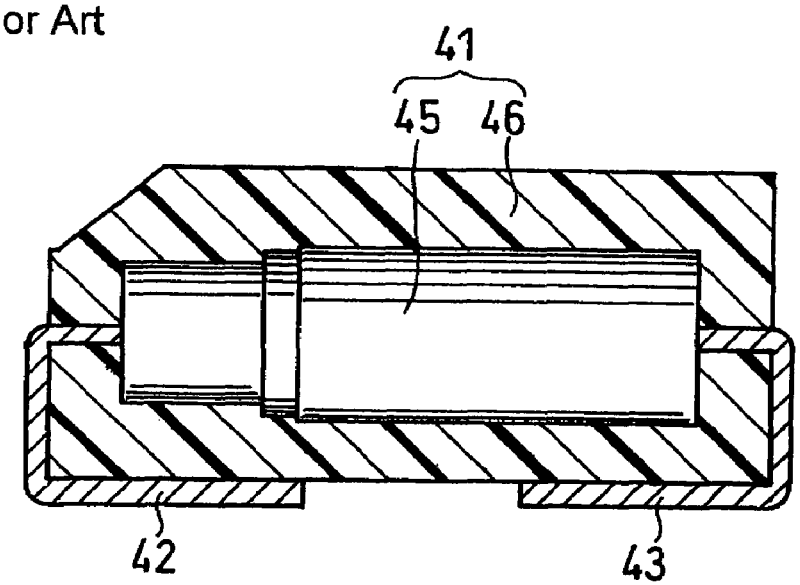

Fig. 5 - Prior Art
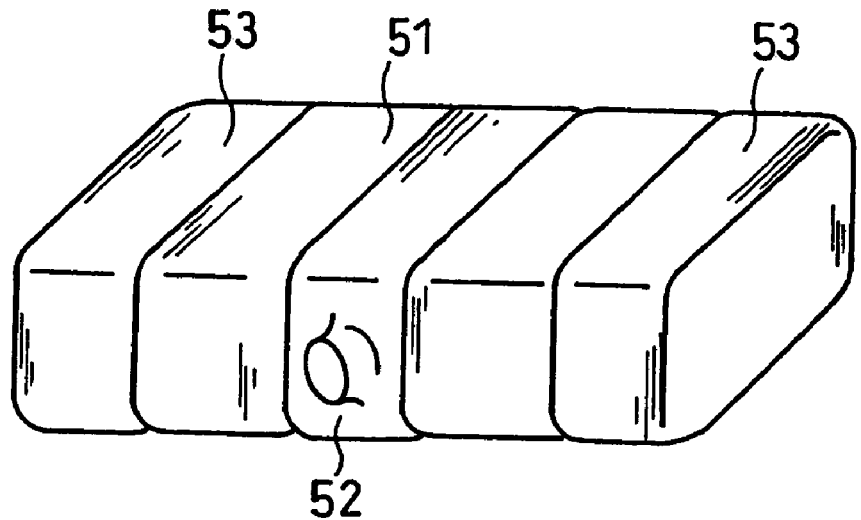
Fig. 6 - Prior Art
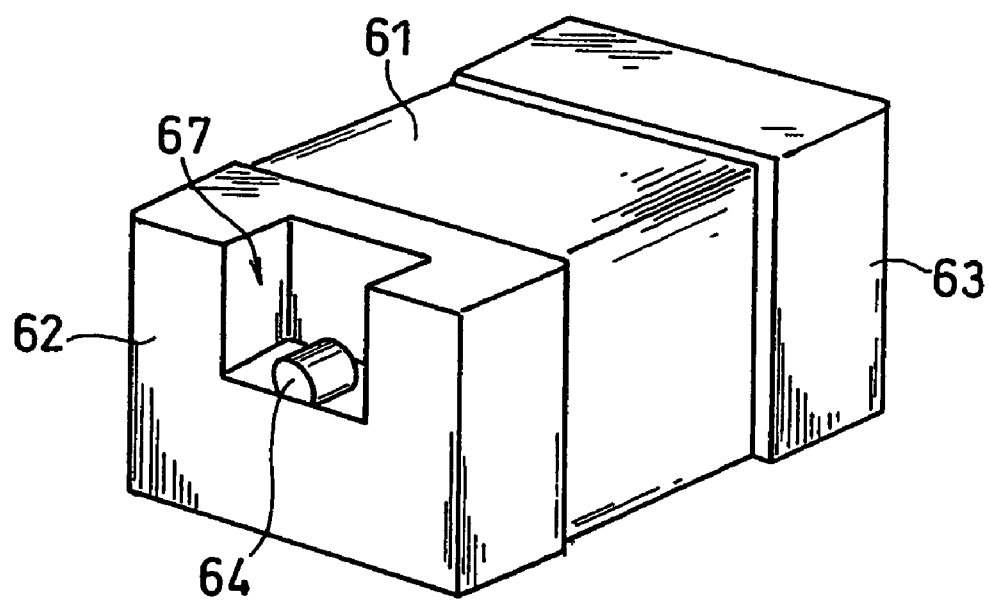

Fig. 7 - Prior Art
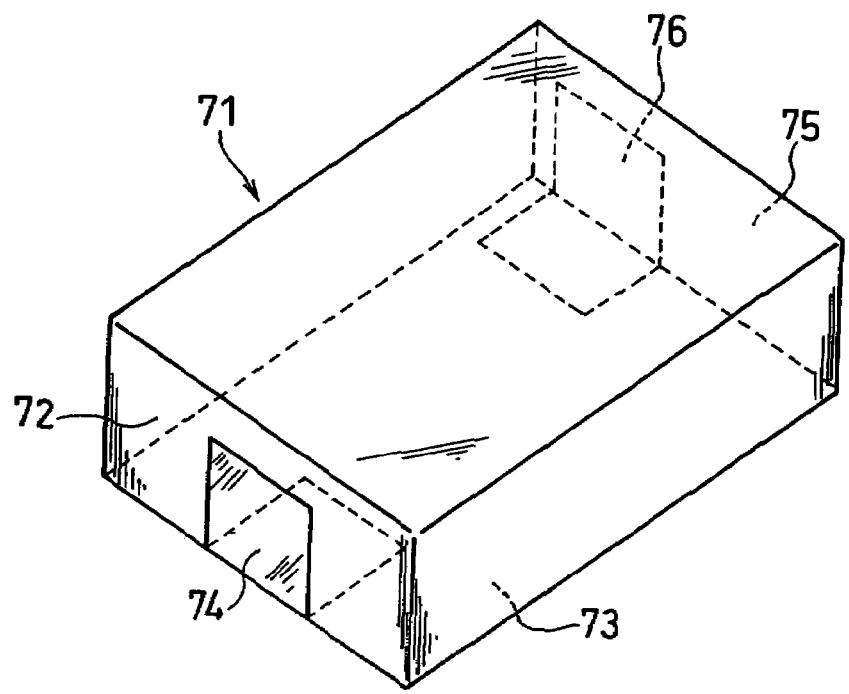
Fig. 8 - Prior Art
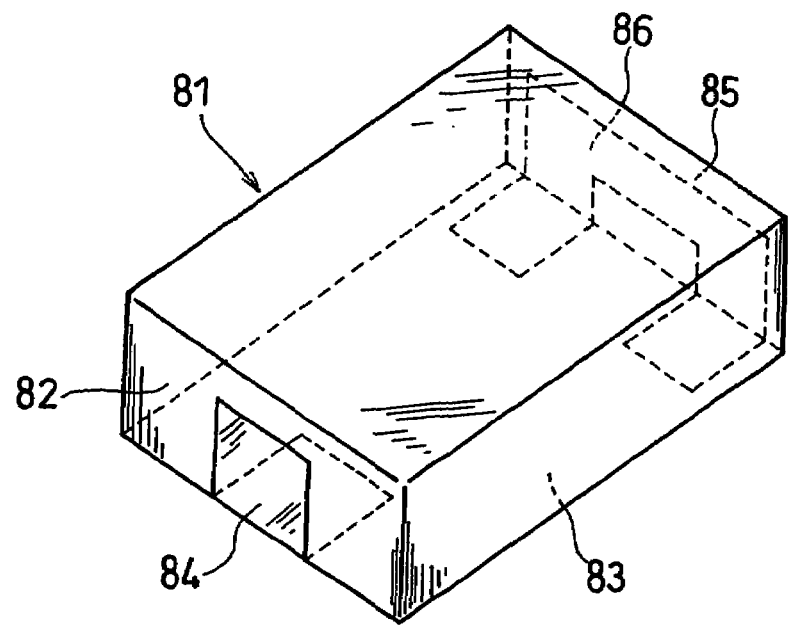

92  91  93

102  101  103  104

CHIP-TYPE BATTERY

BACKGROUND OF THE INVENTION

The present invention relates to a chip-type battery comprising a plurality of power generating elements which are stacked, each element containing a sintered material.

As electronic devices become more and more compact, more electronic components are constructed in the form of chips and they are densely mounted on printed circuit boards. Usually, the electronic components are mounted by reflow soldering. With the increased demand for lead-free electronic devices in recent years, lead-free soldering has become popular for use. Lead-free soldering requires a reflow temperature of about 240° C., which is higher than the conventional reflow temperature of about 200° C. Under the circumstances, electrolytic capacitors containing an electrolyte have gradually been replaced with chip-type all solid state electrolytic capacitors. In addition to this, there are proposed chip-type batteries that can be directly mounted on substrates (Japanese Laid-Open Patent Publication No. Hei 6-231796).

Electrochemical devices such as electrolytic capacitors and batteries have a polarity. Accordingly, when they are used, it is necessary to identify a cathode, or positive electrode, and an anode, or negative electrode. For example, if the polarity of a terminal cannot be identified when an electrochemical device having a polarity is mounted on a substrate, the electrochemical device might be mounted with the anode and the cathode reversed.

FIG. 1 is a perspective view of a typical chip-type electrochemical device. This chip-type electrochemical device has a symmetric structure, and comprises a body 11 having a substantially rectangular parallelepiped shape, a first terminal 12 and a second terminal 13, each terminal arranged at the end of the body 11. This type of shape is adopted into multilayer ceramic capacitors, functional polymer electrolytic aluminum capacitors, etc, which have been commercialized.

Multilayer ceramic capacitors do not have a polarity, and therefore there is no need to identify a first terminal and a second terminal. Functional polymer electrolytic aluminum capacitors and tantalum capacitors, however, do have a polarity, and therefore a first terminal and a second terminal must be identified.

In view of this, in order to identify a first terminal and a second terminal, there is proposed to print, with the use of an ink, a mark 24 for indicating the polarity of a first terminal 22 or a second terminal 23 on a body 21 of an electrochemical device as shown in FIG. 2. Such a mark, however, is not applicable to electrochemical devices produced through sintering process. This is because, since the mark should be printed in the early stages of the production process and the sintering process is usually performed in the latter stages of the production process, the mark printed using an ink is evaporated during the sintering process.

Meanwhile, some electrochemical devices not having a stacked structure have an asymmetric structure with a first terminal and a second terminal of different shapes. A tantalum solid electrolytic capacitor (F95 series manufactured by Nichicon Corporation) shown in FIG. 3, for example, has a cathode terminal 32 and an anode terminal 33 of different shapes arranged at the ends of a body 31. The body 31 comprises a device part 35 and an outer coating resin 36 for covering the device part 35. From the cathode-terminal-side end of the device part 35 is protruded a cathode lead 34. Likewise, a tantalum solid electrolytic capacitor (T491 series manufactured by KEMET Corporation) shown in FIG. 4 is characterized by the shape of the end of a body 41. The body 41 comprises a device part 45 and an outer coating resin 46 for covering the device part 45. The end of the outer coating resin 46 where a cathode terminal 42 is disposed has a different shape from the end of the same where an anode terminal 43 is disposed. It is, however, difficult to adopt the structures described above into electrochemical devices comprising a plurality of power generating elements which are stacked.

Another approach is proposed to address the step of mounting an electrochemical device on a substrate. For example, a solid electrolytic capacitor shown in FIG. 5 is proposed in which a cathode terminal 52 is formed in the center of a body 51 and anode terminals 53 are respectively formed at the ends of the body 51 (Japanese Laid-Open Patent Publication No. Hei 6-232011). Although the purpose is different, there is also proposed a capacitor as shown in FIG. 6 in which a dent 67 is formed at an end of a body 61 having a cathode terminal 62 so that a cathode lead 64 is exposed from the dent 67. Because the cathode terminal 62 has a different shape from an anode terminal 63 in this capacitor, it is easy to identify the polarity (Japanese Laid-Open Patent Publication No. Hei 7-115041). However, in this case also, it is difficult to adopt such a structure into electrochemical devices comprising a plurality of power generating elements which are stacked.

Meanwhile, Japanese Laid-Open Patent Publication No. Hei 11-26297 proposes to house a chip-type capacitor in an outer case 71 having a substantially rectangular parallelepiped shape as shown in FIG. 7. The outer case 71 is provided with an L-shaped first terminal electrode 74 extending from a first side face 72 to a bottom face 73 and an L-shaped second terminal electrode 76 extending from a second side face 75, which is positioned opposite to the first side face 72, to the bottom face 73. The first terminal electrode 74 and the second terminal electrode 76 are formed such that they are in positions displaced from the symmetric position in the outer case 71. The capacitor housed in the outer case 71 is a surface-mounted capacitor using no connecting lead wire. Accordingly, even if an attempt is made to mount it on a circuit board such that the first terminal electrode and the second terminal electrode are reversed, because the position of each terminal on the circuit board does not correspond to that of each electrode on the case, reverse connection can be prevented.

Moreover, Japanese Laid-Open Patent Publication No. Hei 11-26297 proposes to house an electrochemical device in an outer case 81 having a substantially rectangular parallelepiped shape as shown in FIG. 8. The outer case 81 is provided with an L-shaped first terminal electrode 84 extending from a first side face 82 to a bottom face 83 and a second terminal electrode 86 extending from a second side face 85, which is positioned opposite to the first side face 82, to the bottom face 83. In this case, even if the capacitor housed in the outer case 81 is mounted on a circuit board with its polarity reversed, the first terminal electrode 84 and the second terminal electrode 86 do not come in contact with the terminals on the circuit board.

The use of the outer cases as shown in FIGS. 7 and 8, however, requires an increased number of components as well as an increased cost of equipment because it necessitates two different processes: the process to provide the cathode terminal and the process to provide the anode terminal. In other words, the use of the outer cases as shown in the figures is accompanied by the problem of increasing the production cost.

As can be clearly understood from the above, a versatile means for readily identifying a first terminal and a second terminal for a chip-type battery comprising a plurality of power generating elements which are stacked, each element containing a sintered material, has not yet been proposed.

BRIEF SUMMARY OF THE INVENTION

The present invention relates to a chip-type battery comprising: a body having a substantially rectangular parallelepiped shape and containing a plurality of power generating elements which are stacked, each element comprising a sintered material; a first terminal having a first polarity; and a second terminal having a second polarity, wherein the first terminal is provided at a first side face of the body, the second terminal is provided at a second side face of the body which is located on other than the first side face, and the first terminal and the second terminal comprise different metal materials.

In this embodiment, the first terminal and the second terminal preferably comprise different metals capable of absorbing lights at different wavelengths.

The present invention further relates to a chip-type battery comprising: a body having a substantially rectangular parallelepiped shape and containing a plurality of power generating elements which are stacked, each element comprising a sintered material; a first terminal having a first polarity; a second terminal having a second polarity; and a marking member for identifying the polarity of the first terminal and the second terminal, wherein the first terminal is provided at a first side face of the body, the second terminal is provided at a second side face of the body which is located on other than the first side face, the marking member is attached to the outer surface of at least one selected from the group consisting of the first terminal, the second terminal and the body, and the marking member possesses the identification function even at a sintering temperature to obtain the sintered material.

In this embodiment, it is preferred to use a magnetic material as the marking member, more preferably a paint containing a magnetic material.

The present invention is particularly advantageous for chip-type batteries where a combination comprising a body having a substantially rectangular parallelepiped shape, and a first terminal and a second terminal has a shape which is symmetric with respect to at least one plane.

According to the present invention, it is possible to provide a versatile means for readily identifying a first terminal and a second terminal for a chip-type battery comprising a plurality of power generating elements which are stacked, each element comprising a sintered material at low cost. Moreover, according to the present invention, it is possible to efficiently prevent reverse connection when the chip-type batteries described above are mounted on integrated circuit boards (IC boards), large-scale integrated circuit boards (LSI boards), etc.

Preferred embodiments of the present invention will be described below referring to the accompanying drawings.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE SEVERAL VIEWS OF THE DRAWING

FIG. 1 is a perspective view of a typical conventional chip-type electrochemical device.

FIG. 2 is a perspective view of a conventional chip-type electrochemical device having a polarity.

FIG. 3 is a vertical sectional view of a conventional chip-type tantalum solid electrolytic capacitor whose first and second terminals have different shapes.

FIG. 4 is a vertical sectional view of another conventional chip-type tantalum solid electrolytic capacitor whose first and second terminal have different shapes.

FIG. 5 is a perspective view of a conventional solid electrolytic capacitor having a cathode terminal in the center of the body thereof and anode terminals at both ends of the body thereof.

FIG. 6 is a perspective view of a conventional capacitor having a dent at the end of the body thereof having a cathode terminal, from which a cathode lead is exposed.

FIG. 7 is a perspective view of an outer case for conventional surface-mounted chip-type capacitors having a first terminal and a second terminal of different shapes.

FIG. 8 is a perspective view of another outer case for conventional surface-mounted chip-type capacitors having a first terminal and a second terminal of different shapes.

DETAILED DESCRIPTION OF THE INVENTION

Embodiment 1

Figure 9:
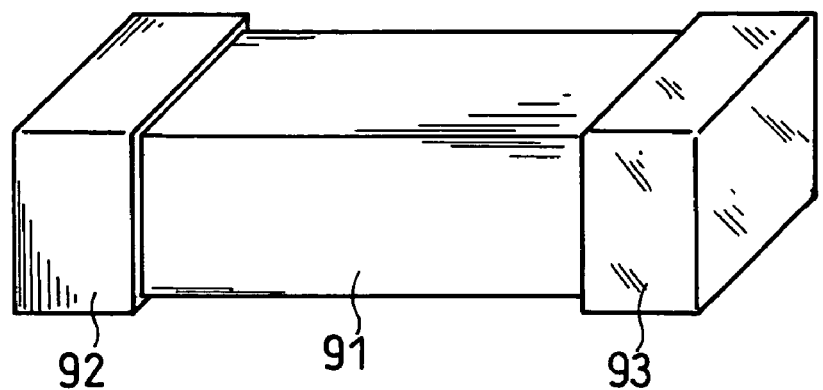
FIG. 9 is a perspective view of a chip-type battery according to Embodiment 1 of the present invention.

Embodiment 1 will be described referring to FIG. 9. This embodiment relates to a chip-type battery comprising a body 91 having a substantially rectangular parallelepiped shape and containing a plurality of power generating elements which are stacked, a first terminal 92 having a first polarity and a second terminal 93 having a second polarity. Each power generating element comprises a sintered material. The first terminal 92 is provided at a first side face of the body 91. The second terminal 93 is provided at a second side face positioned opposite to the first side face. The battery as a whole is symmetric in shape with respect to the center of the body 91.

In this embodiment, the first terminal and the second terminal comprise different metal materials. Because different metal materials have different physical properties (e.g. absorbance wavelength, density, specific resistance, magnetism and the like) depending on the type of metal materials, the first terminal and the second terminal can be identified using the physical properties as the indication. The first terminal and the second terminal may be identified by an identification device. Depending on the physical property used for the indication, the identification may be done visually. The metal materials used for the first terminal and the second terminal preferably have good solder wettability.

For example, when the first terminal is made of tin, nickel, zinc or silver, the second terminal is preferably made of copper, brass or phosphor bronze.

The mounting of chip-type batteries on printed circuit boards are usually automated. For this reason, the mounting device should automatically identify the first terminal and the second terminal. For example, the addition of the function to detect a physical property such as absorbance wavelength, density, specific resistance or magnetism of the first or second terminal so as to identify the first terminal or the second terminal to the mounting device can prevent reverse connection of the batteries during the mounting process. Particularly when the first terminal and the second terminal are made of different metal materials having different absorbance wavelength in the visible light region, the terminals can be identified visually. In mass production, automatic identification can be done by an image sensor.

The whole terminal need not necessarily be made of one metal, and it may comprise a plurality of metals. For example, it is effective to plate the surface of the first terminal and that of the second terminal with different metals. It is also effective to plate either one of the first terminal and the second terminal with a metal different from the substrate metal.

Figure 10:
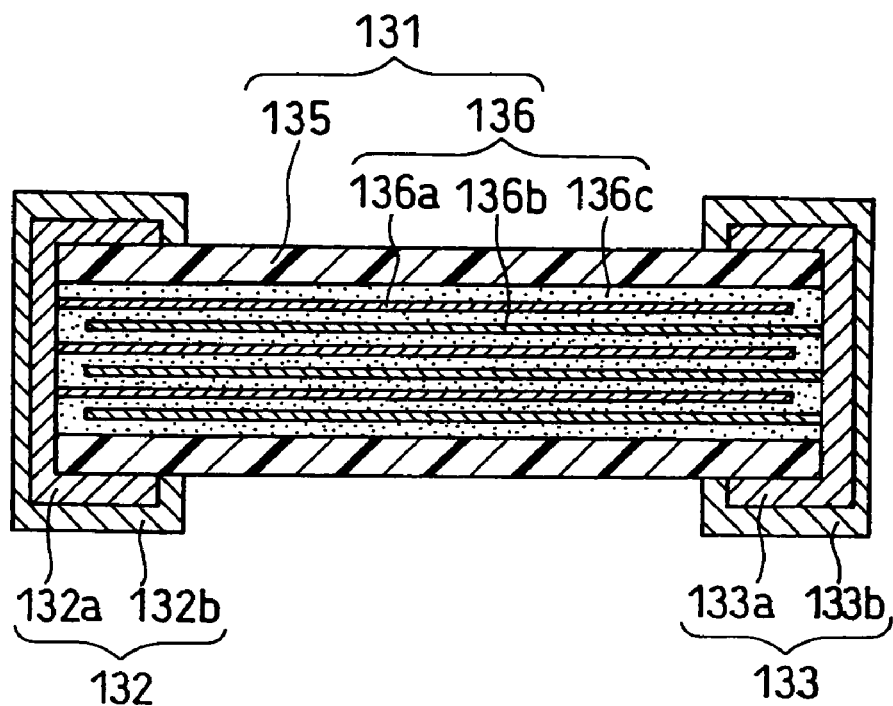
FIG. 10 is a vertical sectional view of another chip-type battery according to Embodiment 1 of the present invention.

FIG. 10 is a vertical sectional view of a chip-type battery having plated-terminals. This chip-type battery comprises a body 131 having a substantially rectangular parallelepiped shape and comprising a stack of a plurality of power generating elements 136 and an outer material 135 for covering or housing the stacked power generating elements 136. Each of the stacked power generating elements 136 comprises a first electrode 136a and a second electrode 136b with a solid electrolyte 136c interposed between the first electrode 136a and the second electrode 136b.

A first terminal 132 having a first polarity is formed at a first side face of the body 131. A second terminal 133 is formed at a second side face of the same. The first terminal and the second terminal are plated with different metals. More specifically, the first terminal comprises a substrate metal 132a and a first plating layer 132b formed on the surface of the substrate metal 132a. The second terminal comprises a substrate metal 133a and a second plating layer 133b formed on the surface of the substrate metal 133a. In the case of the substrate metal 132a of first terminal being made of, for example, nickel, the substrate metal 132a is preferably plated with, for example, tin to form the first plating layer 132b. Likewise, In the case of the substrate metal 133a of second terminal being made of, for example, nickel, the substrate metal 133a is preferably plated with, for example, copper to form the second plating layer 133b.

Embodiment 2

A chip-type battery according to Embodiment 2 will be described with reference to FIG. 11. The chip-type battery shown in FIG. 11 comprises a body 101 having a substantially rectangular parallelepiped shape, a first terminal 102 having a first polarity and a second terminal 103 having a second polarity.

The first terminal 102 is provided at a first side face of the body 101. The second terminal 103 is provided at a second side face positioned opposite to the first side face. The body 101, the first terminal 102 and the second terminal 103 are combined such that the first terminal 102 and the second terminal 103 are symmetric with respect to the center of the body 101. In this embodiment, a button-shaped member 104 serving as an marking member is attached to the outer surface of the second terminal 103.

Figure 11:
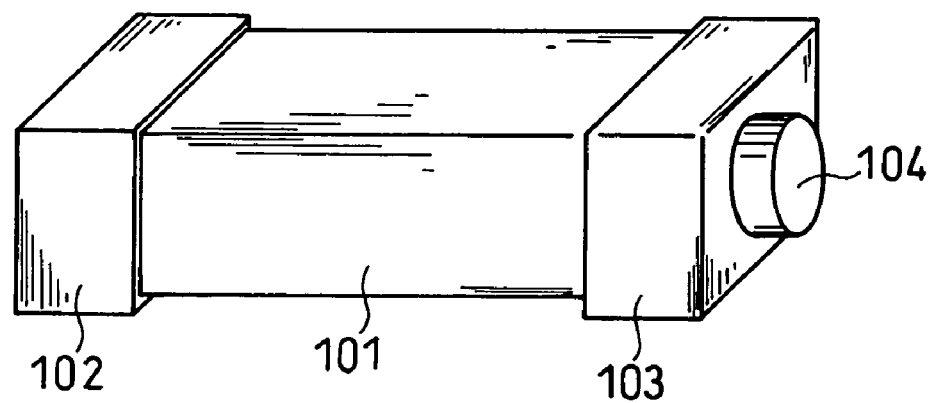
FIG. 11 is a perspective view of a chip-type battery having a button-shaped marking member according to Embodiment 2 of the present invention.
Figure 12:
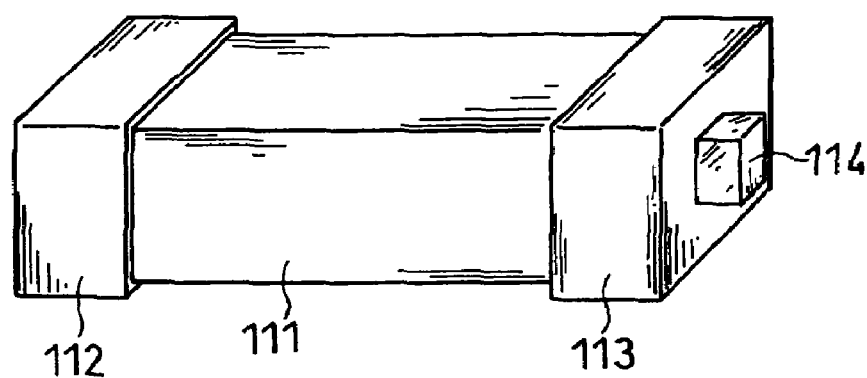
FIG. 12 is a perspective view of a chip-type battery having a rectangular parallelepiped-shaped marking member according to Embodiment 2 of the present invention.

Although the marking member is button-shaped in FIG. 11, it may be in any shape as long as the marking member can be detected visually or by a machine. For example, as shown in FIG. 12, a rectangular parallelepiped-shaped member 114 may be attached. The rectangular parallelepiped-shaped member 114 may be attached to the outer surface of either a first terminal 112 or a second terminal 113, each provided at the end of a body 111. The marking member may be made of the same material as the terminal, or of a different material. In either case, the material for the marking member should have the identification function even at a sintering temperature to obtain the sintered material constituting the power generating elements. Examples of such material include: rare-earth magnets (i.e. magnets containing a rare-earth element) such as Sm—Co based rare-earth magnet and Nd—Fe—B based rare-earth magnet; magnetic materials composed of oxides such as Ba-ferrite and Sr-ferrite; mixtures of a coloring component and a glass frit; and glazes for porcelain. As the coloring component, a compound containing Mn, Fe, Co, Ni, Ru, etc or a pigment can be used. Ferrite-based magnetic materials are particularly suitable for the marking member because they are characterized by low cost and excellent sinterability. The mixtures of a coloring component and a glass frit and the glazes excel in improving visual identification because these materials can impart shine to the marking member.

The method for attaching the marking member to the outer surface of a terminal is not specifically limited. The marking member can be adhered to the terminal with an adhesive, or welded thereto using a laser, or it can be attached by magnetic force.

In this embodiment, the first terminal and the second terminal may be made of different metal materials, or of the same metal material. For example, the first terminal and the second terminal may be made of nickel, and the marking member may also be made of nickel.

Figure 13:
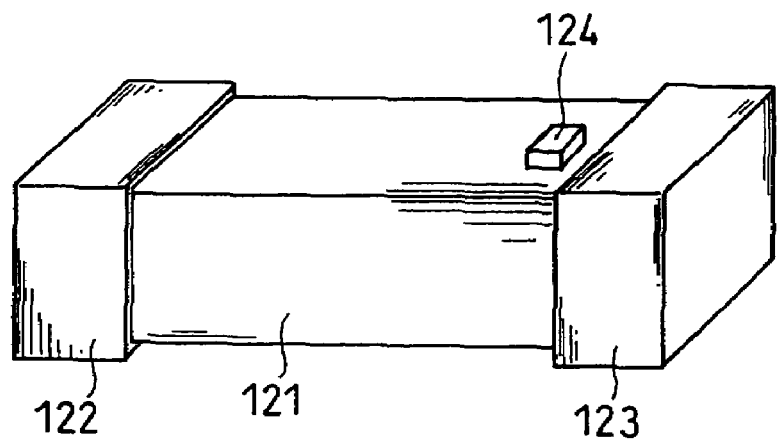
FIG. 13 is a perspective view of another chip-type battery having a rectangular parallelepiped-shaped marking member according to Embodiment 2 of the present invention.

Besides the surface of a terminal as shown in FIGS. 11 and 12, the marking member can be attached to the outer surface of the body in the proximity of one terminal. Specifically, as shown in FIG. 13, a rectangular parallelepiped-shaped member 124 or a marking member having other shape can be attached to the outer surface of a body 121 in the proximity of a first terminal 122 or a second terminal 123, each terminal provided at the end of the body 121. Because the terminals are formed in the latter stages of the battery production process, the effect of the present invention is enhanced when the marking member is attached to the body. Optionally, a plurality of marking members may be attached to the outer surface of a terminal or that of the body in the proximity of the terminal.

The marking member may be a film made of a paste containing a conductive powder. For example, a paste mixture comprising a conductive powder and a resin is applied to the terminal or the body, and the conductive power may be sintered to the terminal or the body during the sintering process of power generating elements.

Embodiment 3

Figure 14:
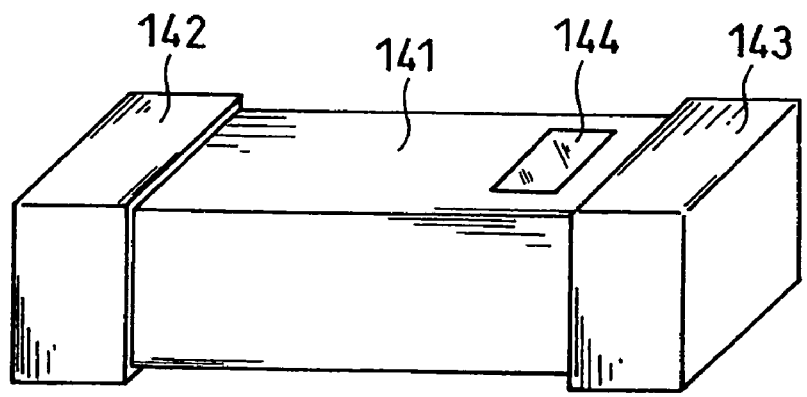
FIG. 14 is a perspective view of a chip-type battery according to Embodiment 3 of the present invention.

A chip-type battery according to Embodiment 3 will be described with reference to FIG. 14. The chip-type battery shown in FIG. 14 comprises a body 141 having a substantially rectangular parallelepiped shape, a first terminal 142 having a first polarity and a second terminal 143 having a second polarity. This battery has the same structure as the battery of Embodiment 2 except that it has a marking member of different type.

In this embodiment, a magnetic material 144 serving as a marking member is attached to the body 141 in the proximity of a second terminal 143. More specifically, a paste containing a powdered magnetic material is applied to a certain portion of the body, followed by drying or sintering to attach the magnetic material to the body. The paste can be prepared by, for example, mixing a powdered magnetic material, a binder and a solvent. An example of the binder for use includes polyvinyl butyral. An example of the solvent includes butyl acetate.

When a magnetic material is used as the marking member, the polarity of terminal can be identified visually, or by the presence or intensity of magnetism. Examples of suitable magnetic material that can be applied to the terminal or the like include Ba-ferrite and Sr-ferrite.

As described above, the present invention is a chip-type battery suitable to be mounted on an IC board or LSI board containing a plurality of power generating elements which are stacked, each element comprising a sintered material, and the battery has a means for readily identifying terminals.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:

1. A stacked-chip battery comprising:
   a body having a substantially rectangular parallelepiped shape and containing a plurality of power generating elements which are stacked, each element comprising a sintered material;
   a first terminal having a first polarity; and a second terminal having a second polarity, wherein:
   said first terminal is provided at a first side face of said body,
   said second terminal is provided at a second side face of said body which is located on other than said first side face,
   said first terminal and said second terminal comprise different metal materials, and
   each of said first terminal and said second terminal has a substrate layer comprising the same metal material and a coating layer comprising a different metal material.

2. The stacked-chip battery in accordance with claim 1, wherein
   said first terminal and said second terminal comprise different metals capable of absorbing lights at different wavelengths, respectively.

3. A stacked-chip battery comprising:
   a body having a substantially rectangular parallelepiped shape and containing a plurality of power generating elements which are stacked, each element comprising a sintered material;
   a first terminal having a first polarity;
   a second terminal having a second polarity; and
   a marking member for identifying the polarity of said first terminal and said second terminal, wherein:
   said first terminal is provided at a first side face of said body,
   said second terminal is provided at a second side face of said body which is located on other than said first side face,
   said marking member is attached to at least one selected from the group consisting of the outer surface of said first terminal, the outer surface of said second terminal and the outer surface of said body on either the first terminal side or the second terminal side,
   said marking member possesses the identification function even at a sintering temperature to obtain said sintered material, and
   each of said first terminal and said second terminal has a substrate layer comprising the same metal material and a coating layer comprising a different metal material.

4. The stacked-chip battery in accordance with claim 3, wherein said marking member comprises a magnetic material.

5. The stacked-chip battery in accordance with claim 3, wherein said marking member comprises a paint containing a magnetic material.

6. The stacked-chip battery in accordance with claim 1, wherein
   said first terminal and said second terminal are positioned such that they are symmetric with respect to at least one plane in the combination comprising said body having a substantially rectangular parallelepiped shape, said first terminal and said second terminal.

7. The stacked-chip battery in accordance with claim 3, wherein
   said first terminal and said second terminal are positioned such that they are symmetric with respect to at least one plane in the combination comprising said body having a substantially rectangular parallelepiped shape, said first terminal and said second terminal.

8. The stacked-chip battery in accordance with claim 3, wherein said marking member comprises a glaze.

* * * * *